US007365582B1

United States Patent
Teo et al.

(10) Patent No.: US 7,365,582 B1
(45) Date of Patent: Apr. 29, 2008

(54) BOOTSTRAPPED CHARGE PUMP DRIVER IN A PHASE-LOCK LOOP

(75) Inventors: Swee-Ann Teo, Sunnyvale, CA (US); Lawrence Tse, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 469 days.

(21) Appl. No.: 10/747,520

(22) Filed: Dec. 29, 2003

Related U.S. Application Data

(60) Provisional application No. 60/470,745, filed on May 14, 2003.

(51) Int. Cl.
*H03L 7/06* (2006.01)

(52) U.S. Cl. .................... 327/157; 327/148
(58) Field of Classification Search ........... 327/147, 327/148, 156, 157, 390, 112; 326/88, 92
See application file for complete search history.

(56) References Cited

U.S. PATENT DOCUMENTS

| | | | | |
|---|---|---|---|---|
| 5,317,206 | A * | 5/1994 | Hanibuchi et al. ........... 326/21 |
| 5,541,536 | A * | 7/1996 | Rajivan .................. 326/98 |
| 5,576,647 | A | 11/1996 | Sutardja et al. ............ 327/108 |
| 5,635,879 | A | 6/1997 | Sutardja et al. ............ 331/57 |
| 5,688,687 | A | 11/1997 | Palsson et al. .......... 435/293.2 |
| 5,959,478 | A | 9/1999 | Ciccone et al. ............ 327/157 |
| 6,154,078 | A * | 11/2000 | Stave ................... 327/263 |
| 6,242,973 | B1 * | 6/2001 | Kong et al. .............. 327/589 |
| 6,255,872 | B1 | 7/2001 | Harada et al. ............ 327/157 |
| 6,326,852 | B1 | 12/2001 | Wakayama ................. 331/17 |
| 6,414,517 | B1 * | 7/2002 | Kim et al. ................. 326/88 |
| 6,466,069 | B1 | 10/2002 | Rozenblit et al. .......... 327/157 |
| 6,535,021 | B1 * | 3/2003 | Song ................... 326/121 |
| 6,825,698 | B2 * | 11/2004 | Wang et al. ............. 327/108 |
| 6,850,091 | B2 * | 2/2005 | Morris .................. 326/86 |
| 2003/0080818 | A1 | 5/2003 | McCarthy ................. 331/17 |
| 2003/0151532 | A1 * | 8/2003 | Chen et al. .............. 341/120 |
| 2004/0199345 | A1 * | 10/2004 | Ananthanarayanan et al. ............... 702/79 |

OTHER PUBLICATIONS

ANSI/IEEE Std. 802.11, 1999 Edition; Part 11: Wireless LAN Medium Access Cntrol (MAC) and Physical Layer (PHY) Specifications; Information technology—Telecommunications and information exchange between systems—Local and metropolitan area networks—Specific requirements; pp. 1-512.

(Continued)

*Primary Examiner*—Kenneth B. Wells

(57) ABSTRACT

A charge pump includes first and second pairs of differential transistors. Each transistor includes control, first, and second terminals. First and second charge pump drivers communicate with the control terminal of one of the first pair of differential transistors and one of the second pair of differential transistors, respectively. Third and fourth charge pump drivers communicate with the control terminal of the other of the first pair of differential transistors and the other of the second pair of differential transistors, respectively. The first through fourth charge pump drivers include respective pairs of differential transistors that receive control signals from respective control circuits.

44 Claims, 6 Drawing Sheets

OTHER PUBLICATIONS

IEEE P802.11g/D8.2 Apr. 2003 (Supplement to ANSI/IEEE std. 802.11 1999(Reaff 2003)) Draft Supplement Standard for Part 11: Wireless LAN Medium Access Cntrol (MAC) and Physical Layer (PHY) Specifications; Information technology—Telecommunications and information exchange between systems—Local and metropolitan area networks—Specific requirements; Further Higher Data Rate Extension in the 2.4 GHz Band; pp. 1-69.

IEEE Std. 802.11a-1999; Supplement to IEEE Standard for Information Technology—Telecommunications and information exchange between systems—Local and metropolitan area networks—Specific requirements; Part: 11 Wireless LAN Medium LAN Medium Access Control (MAC) and Physical Layer (PHY) specifications; High-speed Physical Layer in the 5 GHz Band; pp. 1-83.

IEEE Std. 802.11b; Supplement to IEEE Standard for Information technology—Telecommunications and information exchange between systems—Local and metropolitan area networks—Specific requirements; Part 11: Wireless LAN Medium Access Control (MAC) and Physical Layer (PHY) specifications: Higher-Speed Physical Layer Extension in the 2.4 GHz Band; Approved Sep. 16, 1999; pp. 1-89.

IEEE Std. 802.11b-1999/Cor 1-2001;IEEE Standard for Information technology—Telecommunications and information exchange between systems—Local and metropolitan area networks—Specific requirements; Part 11: Wireless LAN Medium Access Cntrol (MAC) and Physical Layer (PHY) Specifications; Amendment 2: Higher-speed Physical Layer (PHY) extension in the 2.4 GHz band—Corrigendum 1; pp. 1-15.

IEEE Std. 802.16; IEEE Standard for Local and metropolitan area networks; Part 16: Air Interface for Fixed Broadband Wireless Access Systems; Apr. 8, 2002; pp. 1-322.

IEEE Std. 802.16a; IEEE Standard for Local and metropolitan area networks; Part 16: Air Interface for Fixed Broadband Wireless Access Systems—Amendment 2: Medium Access Control Modifications and Additional Physical Layer Specifications for 2-11 GHz; Apr. 1, 2003; pp. 1-292.

IEEE Std. 802.16; IEEE Standard for Local and metropolitan area networks; Part 16: Air Interface for Fixed Broadband Wireless Access Systems; Apr. 8, 2002; pp. 1-322.

"802.16 IEEE Standard for Local and Metropolitan Area Networks; Part 16: Air Interface for Fixed Broadband Wireless Access Systems," 802.16 IEEE Standard for Local and Metropolitan Area Networks, Oct. 1, 2004, pp. i-xxxiv and pp. 1-857, IEEE Std 802.16-2004, IEEE, United States.

* cited by examiner

BOOTSTRAPPED CHARGE PUMP DRIVER IN A PHASE-LOCK LOOP

CROSS-REFERENCE TO RELATED APPLICATIONS

This application claims the benefit of U.S. Provisional Application No. 60/470,745, filed on May 14, 2003, which is hereby incorporated by reference in its entirety.

FIELD OF THE INVENTION

The present invention relates to a phase-lock loops, and more particularly to charge pump drivers for phase-lock loops.

BACKGROUND OF THE INVENTION

High speed data communications channels typically lock onto a phase of a received data stream. The receiving device typically includes a phase-lock loop (PLL) circuit that locks onto the phase of the received data stream. For example, radio frequency (RF) communications channels are established by wireless communications devices in a wireless network.

Referring now to FIG. 1, an exemplary PLL 10 includes a phase detector (PD) 12, a charge pump 14, a loop filter 16, a voltage controlled oscillator (VCO) 18, and a frequency divider 20. The VCO 18 generates an output signal that is divided by the frequency divider 20 and fed back to the PD 12. The PD 12 detects a phase difference between a reference frequency signal 22 (such as the received data stream) and the feedback or divided output signal 24. The PD 12 generates one or more phase difference signals 26, for example signals 30 and 32, that drive the charge pump 14, as will be described below.

The charge pump 14 receives the phase difference signals 26 and generates an output signal that is used to adjust the output of the VCO 18. The output signal may be a pulse width modulated current signal. Performance of the charge pump 14 is typically characterized by switching speed and phase offset. Phase offset refers to the voltage generated by the charge pump 14 when the phase of the reference signal 22 and the feedback signal 24 are the same. Ideally the phase offset of the charge pump 14 is zero.

The output of the charge pump 14 is filtered by the optional loop filter 16. The loop filter 16 may include a capacitor-based integrating circuit, although other types of filters may be used. The desired frequency for the output signal 28 of the VCO 18 may be different than the frequency of the reference signal 22. The frequency divider 20 adjusts the frequency of the output signal 28 based on the ratio of the desired output frequency to the reference frequency.

In some approaches, the phase difference signals 30 and 32 that are generated by the PD 12 are UP and DOWN signals, respectively. UP signals indicate positive differences between the reference signal and the output signal and DOWN signals represent negative differences. Additional details can be found in "Voltage Controlled Oscillator Formed of Two Differential Transconductors", U.S. Pat. No. 5,635,879, to Sutardja et al., which is commonly assigned and which is hereby incorporated by reference in its entirety.

Referring now to FIG. 2, one exemplary charge pump 14 includes a first current source 40 and a second current source 42. One end of the first current source 40 is connected to a first power supply 44 or $V_{dd}$ and an opposite end is connected to transistors 46 and 48. The transistor 46 selectively connects the first current source 40 to a reference node 50. The transistor 48 selectively connects the first current source 40 to an output node 52. The UP signal is applied to an inverter 70, which has an output that communicates with a gate 84 of the transistor 46. An inverted UP signal is applied to an inverter 72, which has an output that communicates with a gate 86 of the transistor 48.

A transistor 58 selectively connects the second current source 42 to the reference node 50. A transistor 60 selectively connects the second current source 42 to the output node 52. An inverted DOWN signal is applied to an inverter 74, which has an output that communicates with a gate 88 of the transistor 58. The DOWN signal is applied to an inverter 76, which has an output that communicates with a gate 90 of the transistor 60. The transistors 46 and 48 are switched in response to the UP and inverted UP signals. The transistors 58 and 60 are switched in response to the DOWN and the inverted DOWN signals. Typically, the inverters 70, 72, 74, and 76 are biased between ground 80 and a supply voltage 82. In this circuit, the gates 84, 86, 88, and 90 are switched from rail to rail, which tends to increase charge injection and phase offset.

An alternative embodiment for driving a charge pump circuit is shown in FIG. 3. Inverters 100, 102, 104, and 106 are biased between a fixed low voltage 108 and a fixed high voltage 110 rather than between supply voltage and ground. For example, the inverters 100, 102, 104, and 106 may be biased by a fixed low voltage such as 1.0 volt and a fixed high voltage such as 1.5 volts for a voltage swing of 0.5 volts.

The circuit arrangement in FIG. 3 reduces charge injection. However, the inverters 100, 102, 104, and 106 do not receive the full range of the voltage supply, which reduces the switching speed of transistors 46, 48, 58, and 60. The switching speed is reduced because the PMOS transistors 46 and 48 do not have sufficient overdrive voltage to quickly charge the gate when switching to $V_{high}$. Likewise, the NMOS transistors 58 and 60 typically do not have sufficient overdrive voltage to quickly discharge the gate to switch to $V_{low}$.

SUMMARY OF THE INVENTION

A charge pump driver according to the present invention includes a first transistor with a control terminal and first and second terminals. A second transistor includes a control terminal and first and second terminals. The second terminal of the first transistor communicates with the first terminal of the second transistor. An AC coupling circuit has an output that communicates with the control terminals of the first and second transistors. A bias circuit biases the control terminals of the first and second transistors.

In other features, an inverter includes an input and an output. The output of the inverter communicates with an input of the AC coupling circuit. The AC coupling circuit includes a first capacitor having one end that communicates with the output of the inverter and an opposite end that communicates with the control terminal of the first transistor. A second capacitor has one end that communicates with the output of the inverter and an opposite end that communicates with the control terminal of the second transistor.

In other features, the first transistor is a PMOS transistor and the second transistor is an NMOS transistor. The inverter is biased by a first voltage potential and a ground potential.

In other features, a system comprises the charge pump driver and further comprises a charge pump including a third transistor having a control terminal that communicates with the second terminal of the first transistor and the first terminal of the second transistor.

In other features, the first terminal of the first transistor communicates with a first voltage potential and the second terminal of the second transistor communicates with a second voltage potential.

A charge pump according to the present invention includes a charge pump driver with an inverter that has an input and an output. The inverter is biased by a supply voltage potential and a ground potential. An overdrive circuit produces an overdrive voltage. A charge pump includes a first transistor having a control terminal that receives the overdrive voltage and first and second terminals. The overdrive voltage of the overdrive circuit is equal to a supply voltage minus a threshold voltage of the first transistor.

In other features, the overdrive circuit includes a second transistor including a control terminal and first and second terminals. A third transistor includes a control terminal and first and second terminals. The second terminal of the first transistor communicates with the first terminal of the second transistor. An AC coupling circuit has an input that communicates with the output of the inverter and an output that communicates with the control terminals of the second and third transistors.

In other features, a bias circuit biases the control terminals of the second and third transistors. The AC coupling circuit includes a first capacitor having one end that communicates with the output of the inverter and an opposite end that communicates with the control terminal of the second transistor. A second capacitor has one end that communicates with the output of the inverter and an opposite end that communicates with the control terminal of the third transistor. The second transistor is a PMOS transistor and the third transistor is an NMOS transistor.

A charge pump driver according to the present invention includes an AC coupling circuit and a pre-driver circuit that communicates with an output of the AC coupling circuit. A bias circuit biases first and second inputs of the pre-driver circuit.

In other features, the pre-driver circuit includes a first transistor including a control terminal and first and second terminals. A second transistor includes a control terminal and first and second terminals. The second terminal of the first transistor communicates with the first terminal of the second transistor.

In other features, an output of the AC coupling circuit communicates with the control terminals of the first and second transistors. An inverter has an output that communicates with an input of the AC coupling circuit. The AC coupling circuit includes a first capacitor having one end that communicates with the output of the inverter and an opposite end that communicates with a first input of the pre-driver circuit. A second capacitor has one end that communicates with the output of the inverter and an opposite end that communicates with a second input of the pre-driver circuit.

In other features, the first transistor is a PMOS transistor and the second transistor is an NMOS transistor. The inverter is biased by a first voltage potential and a ground potential.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
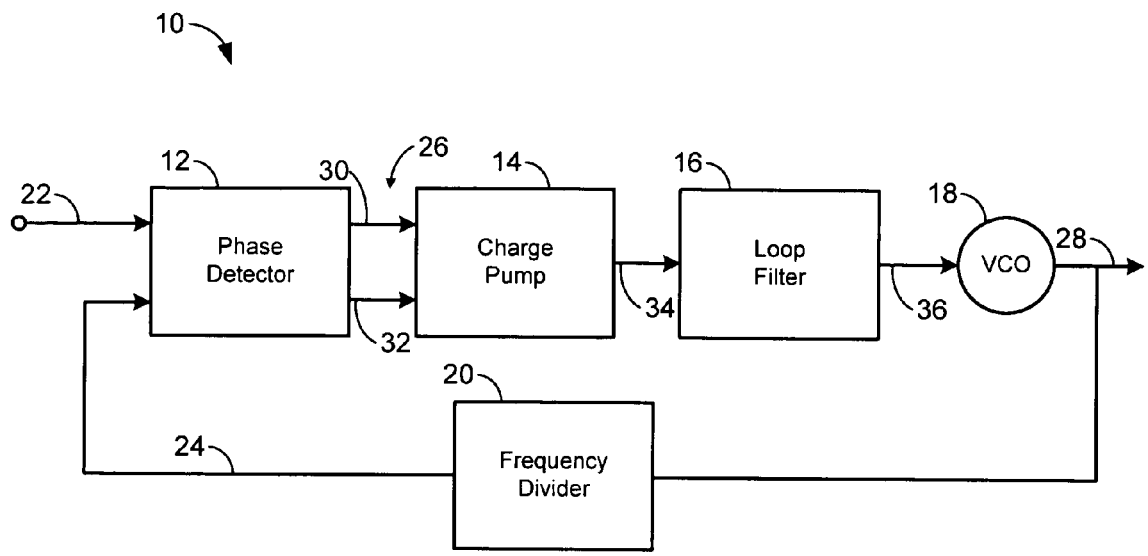
FIG. 1 is a functional block diagram of an exemplary phase-locked loop that includes a charge pump according to the prior art.

The following description of the preferred embodiment(s) is merely exemplary in nature and is in no way intended to limit the invention, its application, or uses. For purposes of clarity, the same reference numbers will be used in the drawings to identify similar elements.

A charge pump driver according to the present invention provides improved switching speed with low phase offset. The charge pump driver uses a bootstrapping approach that increases the overdrive voltage without a corresponding increase in phase offset. Drive voltage is AC-coupled or "boot-strapped" to a transistor in the driver such that the gate voltage of the transistor can be higher than the supply voltage for the NMOS transistors in the charge pump. Also, the gate voltage can be lower than ground for the PMOS transistors in the charge pump.

Figure 4:
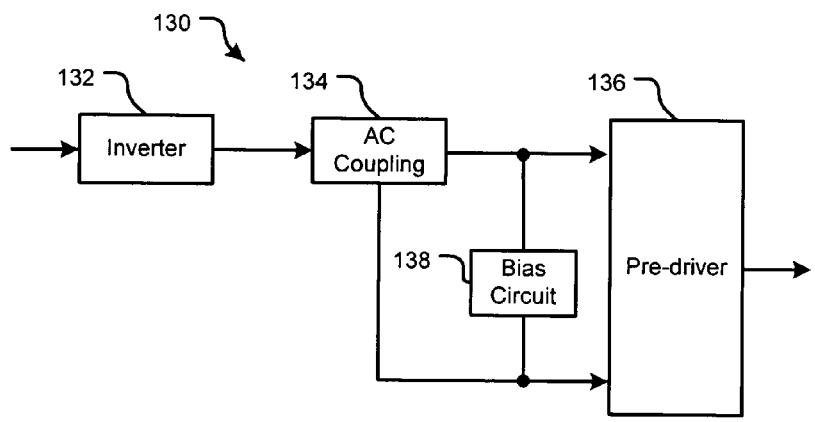
FIG. 4 is a functional block diagram of a charge pump driver according to the present invention.
Figure 2:
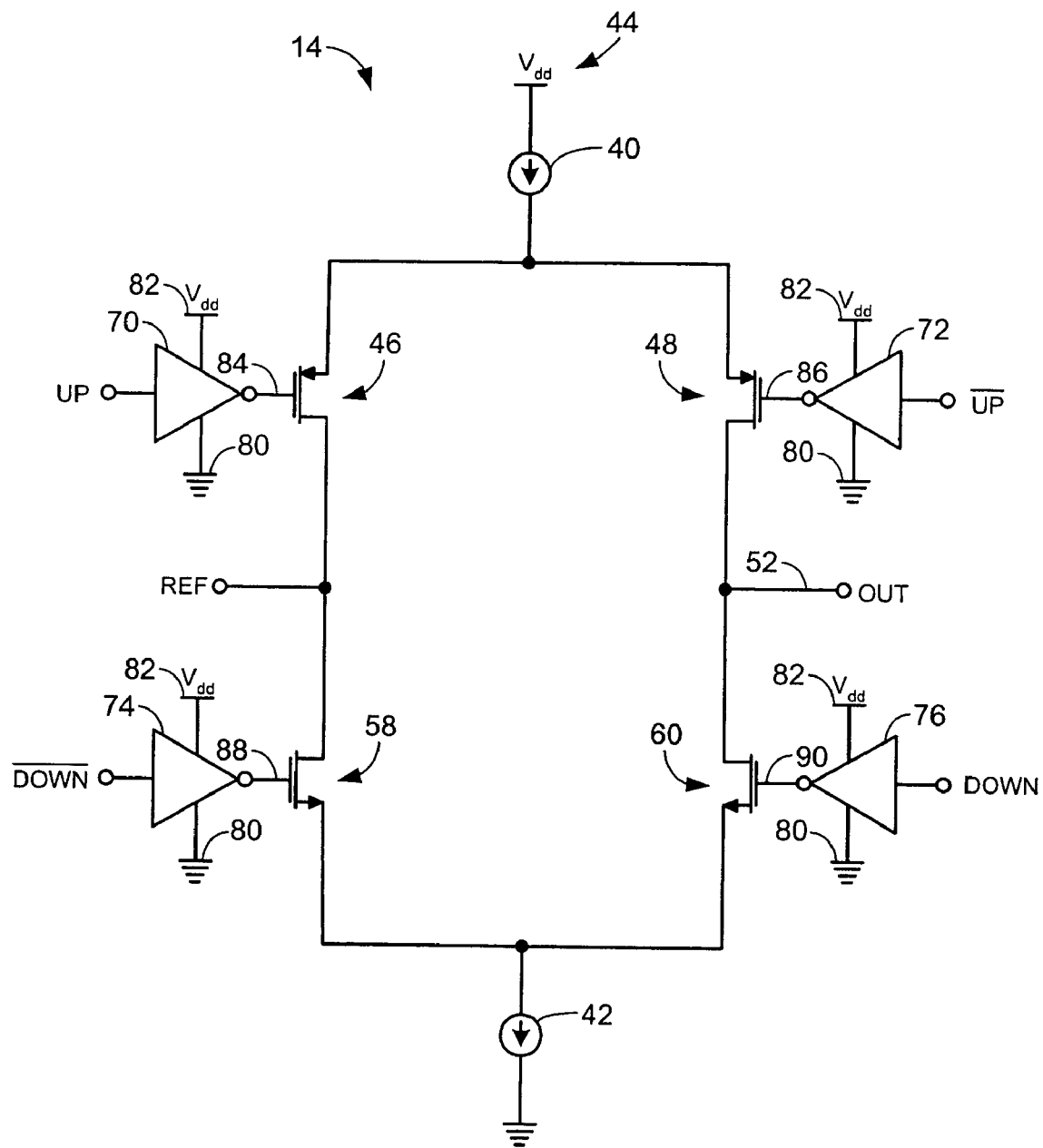
FIG. 2 is an electrical schematic of an exemplary charge pump that is driven by inverters that are biased by supply voltage and ground according to the prior art.

Referring now to FIG. 4, a charge pump driver 130 according to the present invention includes an inverter 132 having an input that receives a phase difference signal. An output of the inverter 132 is input to an AC coupling circuit 134. First and second outputs of the AC coupling circuit are input to a first and second inputs of a pre-driver or overdrive circuit 136. A bias circuit 138 provides a bias signal to the first and second inputs of the pre-driver circuit 136. The charge pump 130 increases the overdrive voltage output by the pre-driver circuit 136 to improve switching speed without increasing phase offset.

Figure 5A:
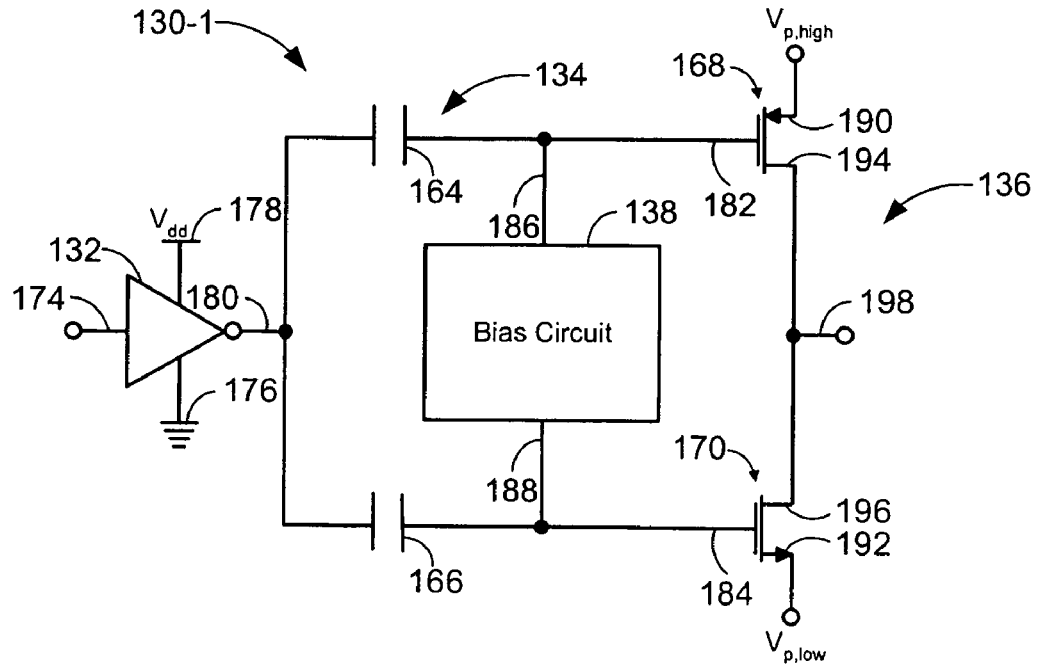
FIGS. 5A and 5B are electrical schematics of a charge pump driver according to the present invention in further detail.

Referring now to FIG. 5A, a charge pump driver 130-1 for PMOS transistors includes the inverter 132, the AC coupling circuit 134 including a first capacitor 164 and a second capacitor 166, the pre-driver 136 including a PMOS transistor 168 and an NMOS transistor 170, and the bias circuit 138. The inverter 132 receives one of the phase difference output signals at input 174 from the PD 12. The inverter 132 is biased by ground 176 and a source voltage 178. The inverter 132 generates a drive voltage 180 that is based on the phase difference signals 174.

The drive voltage 180 is output to one end of the first capacitor 164 and one end of the second capacitor 166. An opposite second end of the first capacitor 164 communicates with a gate 182 of the PMOS transistor 168. An opposite end of the second capacitor 166 communicates with a gate 184 of the NMOS transistor 170. A first output 186 of the bias circuit 138 communicates with the second end of the first capacitor 164 and the gate 182 of the PMOS transistor 168. A second output 188 of the bias circuit 138 communicates with the second end of the second capacitor 166 and the gate 184 of the NMOS transistor 170. The bias circuit 138 biases the gates 182 and 184 of the transistors 168 and 170, respectively. The bias circuit sets the voltages of the transistors so that during operation, the switching on/off of the transistor is enabled.

Figure 5B:
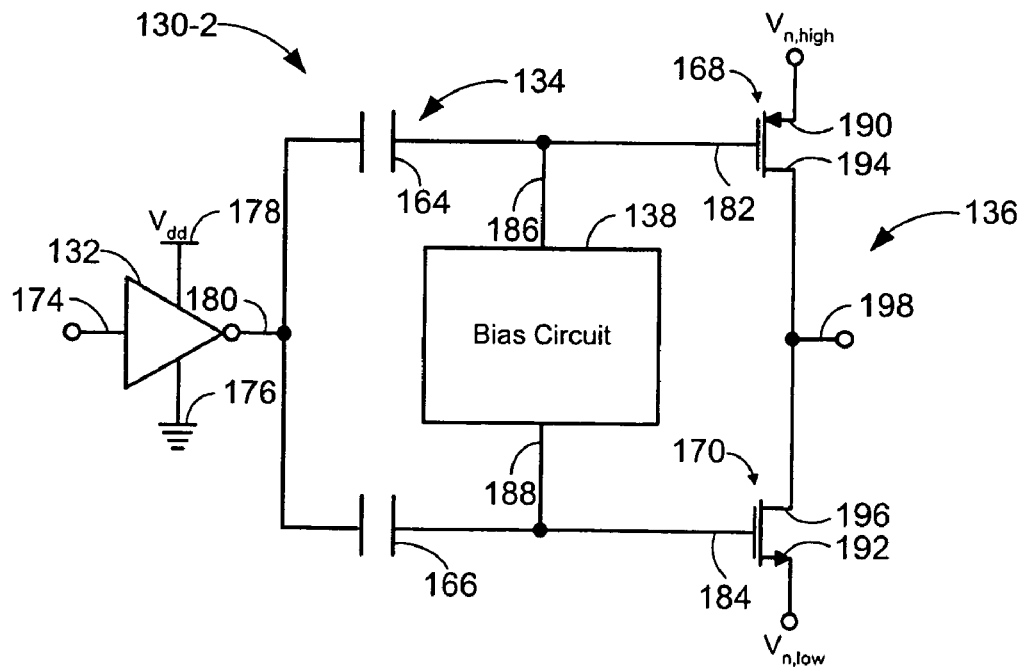

A source terminal 190 of the PMOS transistor 168 communicates with voltage supply $V_{p,high}$. A source terminal 192 of the NMOS transistor 170 communicates with voltage supply $V_{p,low}$. A drain terminal 194 of the PMOS transistor 168 and a drain terminal 196 of the NMOS transistor 170 communicate with each other and with an output node 198. In FIG. 5B, a charge pump driver 130-2 for NMOS transistors is shown. The charge pump drivers 130-1 and 130-2 are similar except for biasing. The source 194 of the PMOS transistor 168 is biased by $V_{n,high}$ and the source of the NMOS transistor 170 is biased by $V_{n,low}$ instead of $V_{p,high}$ and $V_{p,low}$, respectively. Typical values for $V_{n,high}$, $V_{n,low}$, $V_{p,high}$ and $V_{p,low}$ will depend upon the process that is used.

Figure 6:
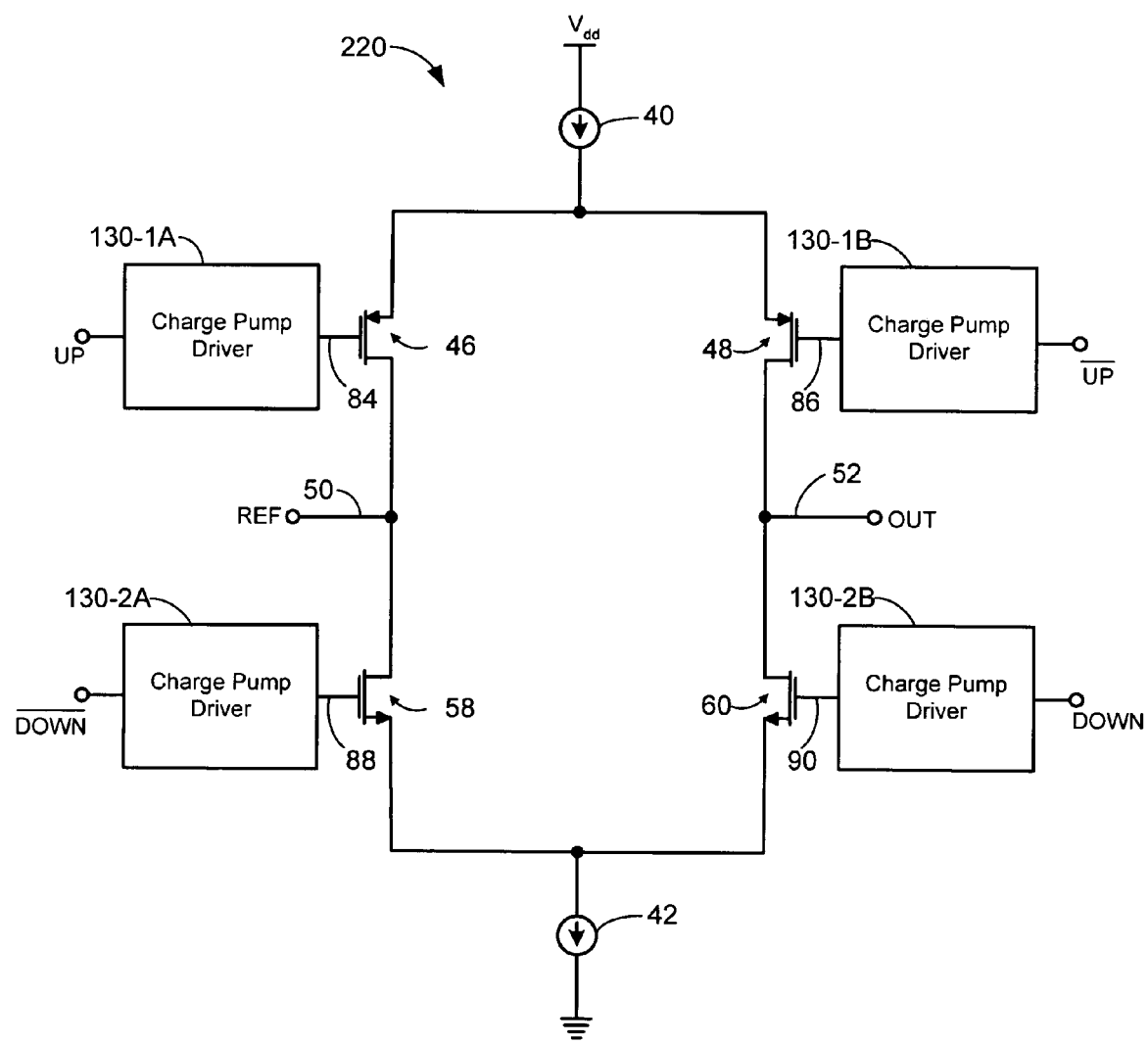
FIG. 6 is a functional block diagram and electrical schematic of a charge pump including the charge pump drivers of FIGS. 5A and 5B.

Referring now to FIG. 6, a charge pump 220 includes the transistors 46 and 48, the transistors 58 and 60, the charge pump drivers 130-1A and 130-1B of FIG. 5A, and the charge pump drivers 130-2A and 130-2B of FIG. 5B. The charge pump driver 130-1A AC-couples a drive voltage to the gate 84 of the PMOS transistor 46. The charge pump driver 130-1B AC-couples a drive voltage to the gate 86 of the transistor 48. The charge pump driver 130-2A AC-couples a drive voltage to the gate 88 of the transistor 58. The charge pump driver 130-2B AC-couples a drive voltage to the gate 90 of the NMOS transistor 60.

A gate voltage of the transistors 58 and 60 can be higher than the supply voltage $V_{dd}$. A gate voltage of the PMOS transistors 46 and 48 can be lower than ground. The overdrive voltage is given by $V_{od} = V_{dd} - V_{th}$ for both the PMOS transistors 46 and 48 and the transistors 58 and 60. $V_{od}$ is the overdrive voltage, $V_{dd}$ is the supply voltage, and $V_{th}$ is a threshold voltage. The resulting increase in overdrive voltage decreases the rise and fall times of the transistors while limiting phase offset. The phase offset is not adversely impacted because the charge pump devices are switched with smaller voltages than the N-type switching device. Only the overdrive voltage to the switching devices are increased.

Figure 3:
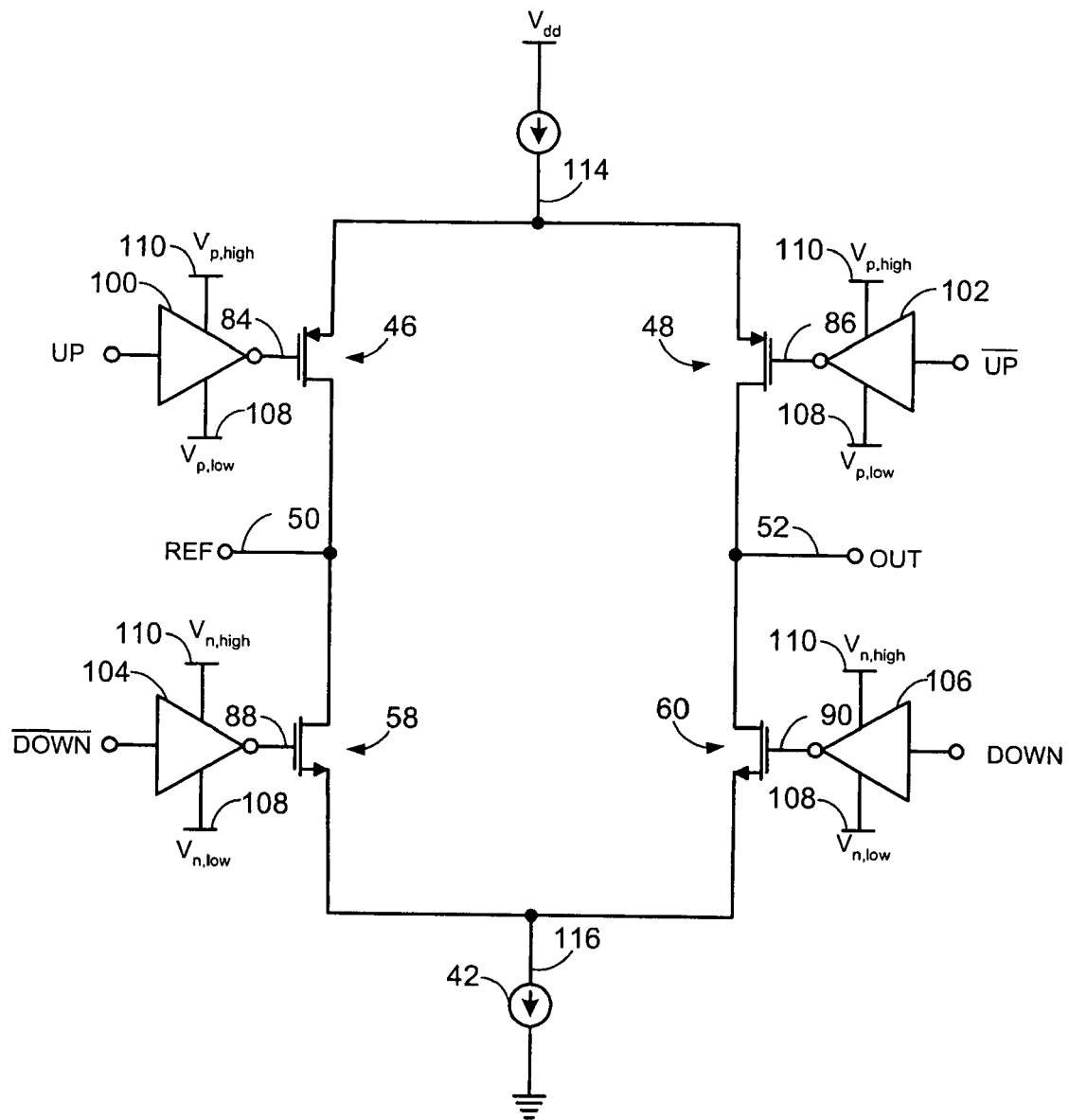
FIG. 3 is an electrical schematic of an alternative charge pump that is driven by inverters that are biased by high and low voltage potentials according to the prior art.

In the charge pump driver of FIG. 3, the overdrive voltage is given by:

$$V_{od,p} = V_{high} - V_{th,p};\text{ and}$$

$$V_{od,n} = V_{supply} - V_{low} - V_{th,n}.$$

In the charge pump driver of FIGS. 4, 5 and 6, the overdrive voltage $V_{od} = V_{supply} - V_{th}$ for both the PMOS and NMOS transistors. Using typical values of $V_{supply} = 3.0V$, $V_{high} = 1.8V$ (for PMOS) and $V_{low} = 1.30V$ (for PMOS), the circuit in FIG. 3 operates with the following overdrive voltages:

$$V_{od,p} = 1.8V - 0.8V = 1.0V\text{ for PMOS; and}$$

$$V_{od,n} = 3.0V - 1.00V - 0.8V = 1.2V\text{ for NMOS.}$$

Using the approach depicted in FIGS. 4, 5 and 6 and described above, the charge pump operates with significantly higher overdrive voltage:

$$V_{od,p} = 3.0V - 0.8V = 2.2V\text{ for PMOS; and}$$

$$V_{od,n} = 3.0V - 0.8V = 2.2V\text{ for NMOS.}$$

The increased overdrive voltage improves switching speed without a corresponding increase in phase offset. While MOS transistors are shown, skilled artisans will appreciate that other transistor types can be used without departing from the invention.

Figure 7:
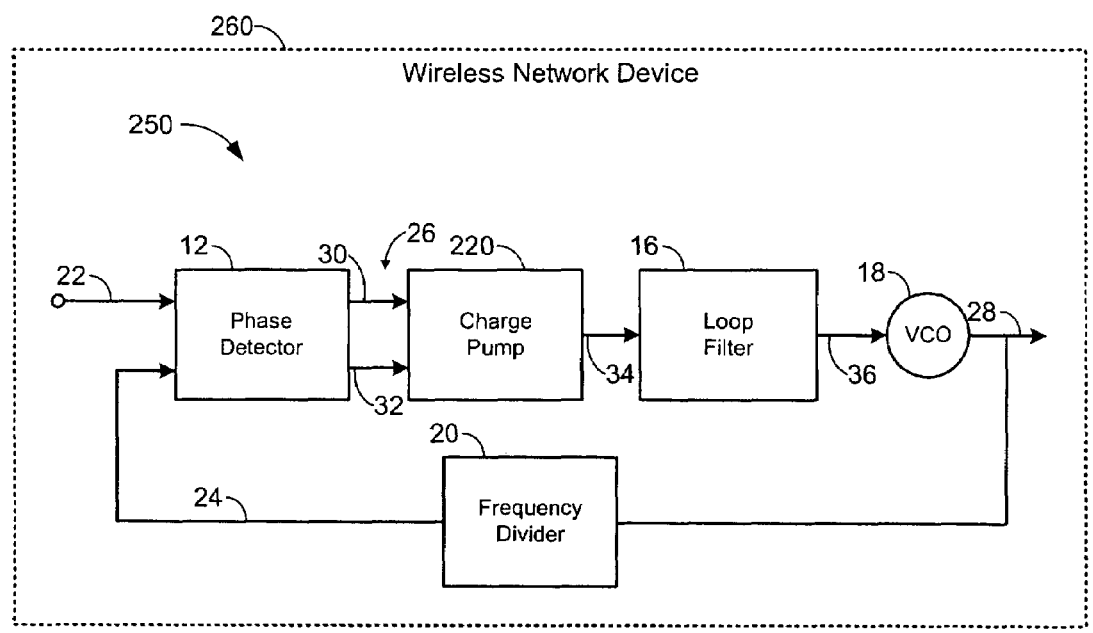
FIG. 7 is a functional block diagram of a wireless network device including a PLL circuit with a charge pump according to the present invention.

Referring now to FIG. 7, the charge pump 220 with the charge pump drivers according to the present invention are implemented in a PLL circuit 250 of a wireless network device 260. The wireless network device 260 is compliant with IEEE sections 802.11, 802.11a, 802.11b, 802.11g, 802.11n, 802.16, and/or other existing or future wireless standards. IEEE sections 802.11, 802.11a, 802.11b, 802.11g, 802.11n, 802.16 are hereby incorporated by reference in their entirety.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A charge pump comprising:
   a first pair of differential transistors, each including a control terminal and first and second terminals;
   a second pair of differential transistors, each including a control terminal and first and second terminals;
   first and second charge pump drivers that communicate with said control terminal of one of said first pair of differential transistors and one of said second pair of differential transistors, respectively, wherein each of said first and second charge pump drivers comprise:
      a third pair of differential transistors, each including a control terminal and first and second terminals; and
      a first control circuit that generates a first control signal for said control terminal of one of said third pair of differential transistors and a second control signal for said control terminal of the other of said third pair of differential transistors;
   third and fourth charge pump drivers that communicate with said control terminal of the other of said first pair of differential transistors and the other of said second pair of differential transistors, respectively, wherein each of said third and fourth charge pump drivers comprise:
      a fourth pair of differential transistors, each including a control terminal and first and second terminals; and
      a second control circuit that generates a third control signal for said control terminal of one of said fourth pair of differential transistors and a fourth control signal for said control terminal of the other of said fourth pair of differential transistors.

2. The charge pump of claim 1 further comprising:
   a first inverter having an output that communicates with an input of said first charge pump driver;

a second inverter having an output that communicates with an input of said second charge pump driver;
a third inverter having an output that communicates with an input of said third charge pump driver; and
a fourth inverter having an output that communicates with an input of said fourth charge pump driver.

3. The charge pump of claim 2 wherein said first inverter receives a first input signal and said second inverter receives an inverse of said first input signal and said fourth inverter receives a second input signal and said third inverter receives an inverse of said second input signal.

4. The charge pump of claim 2 wherein said first control circuit comprises:
an AC coupling circuit that communicates with said first inverter; and
a bias circuit that separately biases said control terminals of said third pair of differential transistors.

5. The charge pump of claim 4 wherein said AC coupling circuit includes:
a first capacitor having one end that communicates with an output of said first inverter and an opposite end that communicates with said control terminal of said one of said third pair of differential transistors; and
a second capacitor having one end that communicates with said output of said first inverter and an opposite end that communicates with said control terminal of the other of said third pair of differential transistors.

6. The charge pump of claim 1 wherein said first, second, third and fourth pairs of differential transistors each include a PMOS transistor and an NMOS transistor.

7. The charge pump of claim 2 wherein said first, second, third and fourth inverters are biased by a first voltage potential and a ground potential.

8. The charge pump of claim 1 wherein said first terminal of said one of said third pair of differential transistors communicates with a first voltage potential and said second terminal of the other of said third pair of differential transistors communicates with a second voltage potential.

9. The charge pump of claim 8 wherein said first control circuit selectively sets said first control signal below said first voltage potential and selectively sets said second control signal above said second voltage potential, and wherein said first voltage potential is greater than said second voltage potential.

10. The charge pump of claim 1 wherein said first terminal of one of said fourth pair of differential transistors communicates with a third voltage potential and said second terminal of the other of said fourth pair of differential transistors communicates with a fourth voltage potential.

11. The charge pump of claim 10 wherein said second control circuit selectively sets said third control signal below said fourth voltage potential and selectively sets said fourth control signal above said third voltage potential, and wherein said third voltage potential is greater than said fourth voltage potential.

12. A phase lock loop circuit comprising the charge pump of claim 1 and further comprising:
a phase detector that receives a reference signal and a feedback signal and that generates phase difference signals, which are output to said charge pump;
a voltage controlled oscillator that communicates with an output of said charge pump and that generates an output signal; and
a frequency divider that receives said output signal and that generates said feedback signal.

13. A wireless communications device comprising the phase lock loop circuit of claim 12 wherein said wireless communications device is compliant with at least one of IEEE sections 802.11, 802.11a, 802.11b, 802.11g, 802.11n, and 802.16.

14. A charge pump driver system, comprising:
first and second charge pump drivers that communicate with a charge pump and that include:
a first pair of differential transistors, each including a control terminal and first and second terminals; and
a first control circuit that generates a first control signal for driving said control terminal of one of said first pair of differential transistors and a second control signal for driving said control terminal of the other of said first pair of differential transistors,
wherein said first and second control signals are different, wherein said first terminal of one of said first pair of differential transistors communicates with a first voltage potential and said second terminal of the other of said first pair of differential transistors communicates with a second voltage potential that is less than said voltage potential, and wherein said first control circuit selectively sets first control signal below said voltage potential and said second control signal above first voltage potential;
third and fourth charge pump drivers that communicate with said charge pump and that comprise:
a second pair of differential transistors, each including a control terminal and first and second terminals; and
a second control circuit that generates a third control signal for driving said control terminal of one of said fourth second pair of differential transistors and a fourth control signal for driving said control terminal of the other of said second pair of differential transistors,
wherein said third and fourth control signals are different, wherein said first terminal of one of said second pair of differential transistors communicates with a third voltage potential and said second terminal of the other of said second pair of differential transistors communicates with a fourth voltage potential that is less than said third voltage potential, and wherein said second control circuit selectively sets said third control signal below said fourth voltage potential and said fourth control signal above said third voltage potential.

15. The charge pump driver system of claim 14 wherein said first and third voltage potentials are different.

16. The charge pump driver system of claim 14 wherein said second and fourth voltage potentials are different.

17. The charge pump driver system of claim 14 further comprising:
a first inverter having an output that communicates with an input of said first charge pump driver;
a second inverter having an output that communicates with an input of said second charge pump driver;
a third inverter having an output that communicates with an input of said third charge pump driver; and
a fourth inverter having an output that communicates with an input of said fourth charge pump driver.

18. The charge pump driver system of claim 17 wherein said first inverter receives a first input signal and said second inverter receives an inverse of said first input signal and said fourth inverter receives a third input signal and said second inverter receives an inverse of said second input signal.

19. The charge pump driver system of claim 14 wherein said first control circuit comprises:
an AC coupling circuit that communicates with said first inverter; and a bias circuit that separately biases said control terminals of said first pair of differential transistors.

20. The charge pump driver system of claim 19 wherein said AC coupling circuit includes:
   a first capacitor having one end that communicates with said output of said first inverter and an opposite end that communicates with said control terminal of one of said first pair of differential transistors; and
   a second capacitor having one end that communicates with said output of said first inverter and an opposite end that communicates with said control terminal of the other of said first pair of differential transistors.

21. The charge pump driver system of claim 14 wherein said first and second pairs of differential transistors each include a PMOS transistor and an NMOS transistor.

22. The charge pump driver system of claim 15 wherein said first, second, third and fourth inverters are biased by a first voltage potential and a ground potential.

23. A charge pump comprising:
   a first pair of differential amplifying means for amplifying, each including a control terminal and first and second terminals;
   a second pair of differential amplifying means for amplifying, each including a control terminal and first and second terminals;
   first and second charge pump driver means for driving that communicate with said control terminal of one of said first pair of differential amplifying means and one of said second pair of differential amplifying means, respectively, wherein each of said first and second charge pump driver means comprise:
      a third pair of differential amplifying means for amplifying, each including a control terminal and first and second terminals; and
      first control means for generating a first control signal for said control terminal of one of said third pair of differential amplifying means and a second control signal for said control terminal of the other of said third pair of differential amplifying means;
   third and fourth charge pump driver means for driving that communicate with said control terminal of the other of said first pair of differential amplifying means and the other of said second pair of differential amplifying means, respectively, wherein each of said third and fourth charge pump driver means comprise:
      a fourth pair of differential amplifying means for amplifying, each including a control terminal and first and second terminals; and
      second control means for generating a third control signal for said control terminal of one of said fourth pair of differential amplifying means and a fourth control signal for said control terminal of the other of said fourth pair of differential amplifying means.

24. The charge pump of claim 23 further comprising:
   first inverting means for inverting and having an output that communicates with an input of said first charge pump driver;
   second inverting means for inverting and having an output that communicates with an input of said second charge pump driver;
   third inverting means for inverting and having an output that communicates with an input of said third charge pump driver; and
   fourth inverting means for inverting and having an output that communicates with an input of said fourth charge pump driver.

25. The charge pump of claim 24 wherein said first inverting means receives a first input signal and said second inverting means receives an inverse of said first input signal and said fourth inverting means receives a second input signal and said third inverting means receives an inverse of said second input signal.

26. The charge pump of claim 24 wherein said first control means comprises:
   AC coupling means for coupling that communicates with said first inverting means; and
   bias means for separately biasing said control terminals of said third pair of differential amplifying means.

27. The charge pump of claim 26 wherein said AC coupling means includes:
   first capacitance means for providing capacitance and having one end that communicates with an output of said first inverting means and an opposite end that communicates with said control terminal of said one of said third pair of differential amplifying means; and
   second capacitance means for providing capacitance and having one end that communicates with said output of said first inverting means and an opposite end that communicates with said control terminal of the other of said third pair of differential amplifying means.

28. The charge pump of claim 23 wherein said first, second, third and fourth pairs of differential amplifying means each include a PMOS transistor and an NMOS transistor.

29. The charge pump of claim 24 wherein said first, second, third and fourth inverting means are biased by a first voltage potential and a ground potential.

30. The charge pump of claim 23 wherein said first terminal of said one of said third pair of differential amplifying means communicates with a first voltage potential and said second terminal of the other of said third pair of differential amplifying means communicates with a second voltage potential.

31. The charge pump of claim 30 wherein said first control means selectively sets said first control signal below said first voltage potential and selectively sets said second control signal above said second voltage potential, and wherein said first voltage potential is greater than said second voltage potential.

32. The charge pump of claim 23 wherein said first terminal of one of said fourth pair of differential amplifying means communicates with a third voltage potential and said second terminal of the other of said fourth pair of differential amplifying means communicates with a fourth voltage potential.

33. The charge pump of claim 32 wherein said second control means selectively sets said third control signal below said fourth voltage potential and selectively sets said fourth control signal above said third voltage potential, and wherein said third voltage potential is greater than said fourth voltage potential.

34. A phase lock loop circuit comprising the charge pump of claim 23 and further comprising:
   phase detecting means for receiving a reference signal and a feedback signal and for generating phase difference signals, which are output to said charge pump;
   voltage controlled oscillating means that communicates with an output of said charge pump for generating an output signal; and
   frequency dividing means for receiving said output signal and for generating said feedback signal.

35. A wireless communications device comprising the phase lock loop circuit of claim 34 wherein said wireless communications device is compliant with at least one of IEEE sections 802.11, 802.11a, 802.11b, 802.11g, 802.11n, and 802.16.

36. A charge pump driver system, comprising:
first and second charge pump driver means for driving that communicate with a charge pump and that include:
a first pair of differential amplifying means for amplifying, each including a control terminal and first and second terminals; and
first control means for generating a first control signal for driving said control terminal of one of said first pair of differential amplifying means and a second control signal for driving said control terminal of the other of said first pair of differential amplifying means,
wherein said first and second control signals are different, wherein said first terminal of one of said first pair of differential amplifying means communicates with a first voltage potential and said second terminal of the other of said first pair of differential amplifying means communicates with a second voltage potential that is less than said voltage potential, and wherein said first control means selectively sets first control signal below said voltage potential and said second control signal above first voltage potential;
third and fourth charge pump driver means for driving that communicate with said charge pump and that comprise:
a second pair of differential amplifying means for amplifying, each including a control terminal and first and second terminals;
second control means for generating a third control signal for driving said control terminal of one of said second pair of differential amplifying means and a fourth control signal for driving said control terminal of the other of said second pair of differential amplifying means,
wherein said third and fourth control signals are different, wherein said first terminal of one of said second pair of differential amplifying means communicates with a third voltage potential and said second terminal of the other of said second pair of differential amplifying means communicates with a fourth voltage potential that is less than said third voltage potential, and wherein said second control means selectively sets said third control signal below said fourth voltage potential and said fourth control signal above said third voltage potential.

37. The charge pump driver system of claim 36 wherein said first and third voltage potentials are different.

38. The charge pump driver system of claim 36 wherein said second and fourth voltage potentials are different.

39. The charge pump driver system of claim 36 further comprising:
first inverting means for inverting and having an output that communicates with an input of said first charge pump driver;
second inverting means for inverting and having an output that communicates with an input of said second charge pump driver;
third inverting means for inverting and having an output that communicates with an input of said third charge pump driver; and
fourth inverting means for inverting and having an output that communicates with an input of said fourth charge pump driver.

40. The charge pump driver system of claim 39 wherein said first inverting means receives a first input signal and said second inverting means receives an inverse of said first input signal and said fourth inverting means receives a third input signal and said second inverting means receives an inverse of said second input signal.

41. The charge pump driver system of claim 36 wherein said first control means comprises:
AC coupling means for coupling and that communicates with said first inverting means; and
bias means for separately biasing said control terminals of said first pair of differential amplifying means.

42. The charge pump driver system of claim 41 wherein said AC coupling means includes:
first capacitance means for providing capacitance and having one end that communicates with said output of said first inverting means and an opposite end that communicates with said control terminal of one of said first pair of differential amplifying means; and
second capacitance means for providing capacitance and having one end that communicates with said output of said first inverting means and an opposite end that communicates with said control terminal of the other of said first pair of differential amplifying means.

43. The charge pump driver system of claim 36 wherein said first and second pairs of differential amplifying means each include a PMOS transistor and an NMOS transistor.

44. The charge pump driver system of claim 37 wherein said first, second, third and fourth inverting means are biased by a first voltage potential and a ground potential.

* * * * *

UNITED STATES PATENT AND TRADEMARK OFFICE
CERTIFICATE OF CORRECTION

PATENT NO. : 7,365,582 B1  Page 1 of 1
APPLICATION NO. : 10/747520
DATED : April 29, 2008
INVENTOR(S) : Swee-Ann Teo et al.

It is certified that error appears in the above-identified patent and that said Letters Patent is hereby corrected as shown below:

Title Page 2　　　　　　　　　　Item [56] under "Other Publications" delete the second duplicate reference to "IEEE Std. 802.16; IEEE Standard for Local and metropolitan area networks..."

Column 1, Line 13　　　　　　　Delete "a" after "to"

Column 8, Line 30 Claim 14　　Delete "fourth"

Signed and Sealed this

Second Day of September, 2008

JON W. DUDAS
*Director of the United States Patent and Trademark Office*